(12) United States Patent
Kezuka et al.

(10) Patent No.: US 6,831,048 B2
(45) Date of Patent: Dec. 14, 2004

(54) DETERGENT COMPOSITION

(75) Inventors: Takehiko Kezuka, Settsu (JP); Mitsushi Itano, Settsu (JP)

(73) Assignee: Daikin Industries, Ltd., Osaka (JP)

( * ) Notice: Subject to any disclaimer, the term of this patent is extended or adjusted under 35 U.S.C. 154(b) by 0 days.

(21) Appl. No.: 10/257,944

(22) PCT Filed: Apr. 26, 2001

(86) PCT No.: PCT/JP01/03620

§ 371 (c)(1), (2), (4) Date: Oct. 23, 2002

(87) PCT Pub. No.: WO01/81525

PCT Pub. Date: Apr. 1, 2001

(65) Prior Publication Data

US 2003/0082912 A1 May 1, 2003

(30) Foreign Application Priority Data

| Apr. 26, 2000 | (JP) | 2000-125237 |
| May 23, 2000 | (JP) | 2000-152067 |
| May 23, 2000 | (JP) | 2000-152072 |
| May 23, 2000 | (JP) | 2000-152073 |

(51) Int. Cl.$^7$ .............................................. C11D 7/50
(52) U.S. Cl. .................. 510/175; 510/176; 510/255; 134/3; 134/2
(58) Field of Search .................. 510/175, 176, 510/177, 178, 238, 424, 417, 201, 202, 245, 255, 264, 499; 134/1.3, 2, 3; 438/745

(56) References Cited

U.S. PATENT DOCUMENTS

| 4,165,295 A | * | 8/1979 | Vander Mey | 510/176 |
| 5,556,833 A | | 9/1996 | Howe | 510/189 |
| 5,698,503 A | * | 12/1997 | Ward et al. | 510/176 |
| 5,792,274 A | | 8/1998 | Tanabe et al. | 134/1.3 |
| 6,030,932 A | * | 2/2000 | Leon et al. | 510/175 |
| 6,323,169 B1 | * | 11/2001 | Abe et al. | 510/176 |

FOREIGN PATENT DOCUMENTS

| EP | 0773480 A1 | | 5/1997 |
| EP | 0901160 A2 | | 3/1999 |
| EP | 1091254 A2 | | 4/2001 |
| JP | 54010002 A | * | 1/1979 |
| JP | 11-323394 | | 11/1999 |

OTHER PUBLICATIONS

International Search Report dated Jul. 31, 2001.

European Patent Office Communication with Supplementary European Search Report for Corresponding European Patent Application No. 01 92 5952 dated Jun. 6, 2003.

* cited by examiner

*Primary Examiner*—Gregory Webb
(74) *Attorney, Agent, or Firm*—Armstrong, Kratz, Quintos, Hanson & Brooks, LLP

(57) ABSTRACT

A cleaning composition comprising (1) at least one of fluoride salts and hydrogendifluoride salts; (2) an organic solvent having a hetero atom or atoms; and (3) water; a method of cleaning metal gate, contact hole, via hole and capacitor using the composition; a method of cleaning a residual polymer derived from a resist using the composition; and a method of cleaning after CMP using the composition.

18 Claims, No Drawings

DETERGENT COMPOSITION

TECHNICAL FIELD

The present invention relates to a cleaning composition for use in the process of producing a semiconductor. Specifically the invention relates to a composition which can be used in cleaning a metal gate, a contact hole, a via hole, a capacitor or the like, in removing a polymer derived from a resist and in cleaning after CMP. More specifically, the invention relates to a cleaning composition which can be suitably used in producing a semiconductor device or a liquid crystal panel device such as IC, LSI or the like.

BACKGROUND ART

Conventionally poly-Si has been used as a material for a gate electrode in a semiconductor device. With microminiaturization, there is a possibility of using tungsten, copper, aluminum or like metals as a material for a gate electrode. Now SPM ($H_2SO_4$—$H_2O_2$—$H_2O$), APM ($NH_4OH$—$H_2O_2$—$H_2O$), HPM(HCl—$H_2O_2$—$H_2O$), DHF (HF—$H_2O$), etc. are used as a cleaning composition for cleaning a gate, a contact hole, a capacitor or the like. However, these compositions easily corrode metals so that there is a demand for a cleaning composition which is unlikely to corrode metals and which can remove a polymer derived from a resist, a native oxide and the like.

When a semiconductor device or a liquid crystal panel device such as IC or LSI is produced, the following steps are carried out. A photo-resist is uniformly applied to a film of electroconductive metal such as aluminum, copper, aluminum-copper alloy or the like or to an insulating film such as $SiO_2$ film, each formed on a substrate. Then a resist pattern is formed by lithography technique, and the electroconductive metal film or the insulating film is selectively etched. After etching, a residual resist is removed by ashing, by polymer removing composition and the like.

Known polymer-removing compositions include, for example, those comprising an aqueous solution of a fluoride salt, a water-soluble organic solvent such as DMF, DMSO or the like and optionally hydrofluoric acid as disclosed in Japanese Unexamined Patent Publications No.197681/1997 and No.47401/2000. However, it is difficult for a polymer-removing composition to satisfy two requirements, i.e. a low property of corroding a metal and a high ability of removing a polymer. Thus, conventional polymer-removing compositions remain to be improved in the balance of the two requirements.

With increased complexity of element structure of IC and progress of multi-level interconnection, single damascene or dual damascene process is carried out in formation of interconnection. The damascene process includes polishing (CMP: Chemical Mechanical Polishing) a surface of the article using an abrasive so that numerous particles derived from the abrasive adhere to the surface of the article after damascene process, and particles may become lodged in the surface of the film during polishing. After conventional CMP of oxide film, the article is cleaned with a brush using a cleaning composition such as DHF(HF—$H_2O$), APM ($NH_4OH$—$H_2O_2$—$H_2O$) or the like. However, metals such as Al, Al—Cu, Cu or TiN exist on the surface of the article in damascene process. Thus the above-mentioned cleaning composition is difficult to use because the composition is likely to corrode the metal surface.

DISCLOSURE OF THE INVENTION

An object of the present invention is to provide a cleaning composition which shows a low property of corroding metals and an ability of removing a polymer, a native oxide and the like and which is usable for cleaning a metal gate, a contact hole, a via hole, a capacitor or the like.

Another object of the invention is to provide a polymer-removing composition which can be suitably used in producing a semiconductor device or a liquid crystal panel device such as IC or LSI and which shows a low property of corroding a metal and a high capacity of removing a polymer.

A further object of the invention is to provide a cleaning composition which can remove slurry particles from the surface of an article after CMP in single damascene and dual damascene process and which shows a low property of corroding metals or substrates of Al, Al—Cu, Cu, TiN and the like which are likely to corrode.

The present invention includes the subject matters defined in the following items.

Item 1. A cleaning composition comprising (1) at least one of fluoride salts and hydrogendifluoride salts; (2) an organic solvent having a hetero atom or atoms; and (3) water.

Item 2. The cleaning composition according to item 1, wherein at least one of fluoride salts and hydrogendifluoride salts is formed from hydrofluoric acid and at least one member selected from the group consisting of ammonia, hydroxylamines, aliphatic amines, aromatic amines and aliphatic or aromatic quaternary ammonium salts.

Item 3. The cleaning composition according to item 1, wherein (2) the organic solvent having a hetero atom or atoms is at least one member selected from the group consisting of N,N-dimethylformamide, N,N-dimethylacetamide, dimethylsulfoxide, N-methyl-2-pyrrolidone, 1,3-dimethyl-2-imidazolidinone; methanol, ethanol, isopropyl alcohol (IPA), 1-propanol, 1-butanol, 2-butanol, t-butanol, 2-methyl-1-propanol, 1-pentanol, 1-hexanol, 1-heptanol, 4-heptanol, 1-octanol, 1-nonylalcohol, 1-decanol, 1-dodecanol and like alcohols; ethylene glycol, 1,2-propanediol, propylene glycol, 2,3-butanediol, glycerin and like polyols; acetone, acetylacetone, methyl ethyl ketone and like ketones; acetonitrile, propionitrile, butyronitrile, isobutyronitrile, benzonitrile and like nitriles; formaldehyde, acetaldehyde, propionaldehyde and like aldehydes; ethylene glycol monomethyl ether, ethylene glycol monoethyl ether, diethylene glycol monobutyl ether and like alkylene glycol monoalkyl ethers; tetrahydrofuran, dioxane and like cyclic ethers; trifluoroethanol, pentafluoropropanol, 2,2,3,3-tetrafluoropropanol and like fluoroalcohols; sulfolane and nitromethane.

Item 4. The cleaning composition according to item 3, wherein (2) the organic solvent having a hetero atom or atoms is at least one oxygen-containing organic solvent selected from the group consisting of alcohols and ketones.

Item 5. The cleaning composition according to item 4, wherein (2) the oxygen-containing organic solvent is at least one member selected from the group consisting of isopropyl alcohol, ethanol and methanol, and the concentration of water is 10% by mass or lower.

Item 6. The cleaning composition according to item 4, wherein (2) the oxygen-containing organic solvent is acetone and the concentration of water is 20 to 40% by mass.

Item 7. The cleaning composition according to item 1, which comprises (1) a fluoride salt represented by $NR_4F$ (wherein Rs are the same or different and each is a straight-chain or branched-chain alkyl group of 1 to 12 carbon atoms which may be substituted with a fluorine atom or atoms, a phenyl group which may be substituted with a fluorine atom or atoms, or a hydrogen atom) in a concentration of 1% by mass or lower and/or a hydrogendifluoride salt represented by $NR_4HF_2$ (wherein Rs are as defined above) in a concentration of 0.001 to 1% by mass; (3) water in a concentration of 10% by mass or lower; and (2) at least one member selected from the group consisting of isopropyl alcohol, ethanol and methanol as the remainder.

Item 8. The cleaning composition according to item 1, wherein a fluoride salt represented by $NR_4F$ (wherein Rs are the same or different and each is a straight-chain or branched-chain alkyl group of 1 to 12 carbon atoms which may be substituted with a fluorine atom or atoms, a phenyl group which may be substituted with a fluorine atom or atoms, or a hydrogen atom) in a concentration of 1% by mass or lower and/or a hydrogendifluoride salt represented by $NR_4HF_2$ (wherein R is as defined above) in a concentration of 0.001 to 1% by mass; (3) water in a concentration of 20 to 40% by mass; and (2) acetone as the remainder.

Item 9. The cleaning composition according to item 1, which further comprises (4) at least one member selected from the group consisting of an anionic surfactant, a cationic surfacatant, a nonionic surfactant and an amphoteric surfactant.

Item 10. The cleaning composition according to item 9, wherein (4) the surfactant is an anionic surfactant.

Item 11. The cleaning composition according to item 10, wherein (4) the anionic surfactant has a sulfonic acid group.

Item 12. The cleaning composition according to item 11, wherein (4) the anionic surfactant is at least one member selected from the group consisting of a compound represented by $C_nH_mC_6H_3(SO_3H)Oph(SO_3H)$ (wherein ph is a phenylene group, n is an integer of 1 to 30 and m is an integer of 3 to 61) and a metal salt, an ammonium salt, a primary amine salt, a secondary amine salt and a tertiary amine salt of the compound.

Item 13. The cleaning composition according to item 11, wherein (4) the anionic surfactant is at least one member selected from the group consisting of a compound represented by $C_nH_mph(SO_3H)$ (wherein ph is a phenylene group, n is an integer of 1 to 30 and m is an integer of 3 to 61) and a metal salt, an ammonium salt, a primary amine salt, a secondary amine salt and a tertiary amine salt of the compound.

Item 14. The cleaning composition according to item 10, wherein the content of (4) the anionic surfactant is 0.001 to 10% by mass.

Item 15. The cleaning composition according to item 10, which comprises (1) a fluoride salt represented by $NR_4F$ (wherein Rs are the same or different and each is a straight-chain or branched-chain alkyl group of 1 to 12 carbon atoms which may be substituted with a fluorine atom or atoms, a phenyl group which may be substituted with a fluorine atom or atoms, or a hydrogen atom) in a concentration of 1% by mass or lower and/or a hydrogendifluoride salt represented by $NR_4HF_2$ (wherein Rs are as defined above) in a concentration of 0.001 to 1% by mass; (3) water in a concentration of 60% by mass or lower; (4) an anionic surfactant in a concentration of 0.001 to 10% by mass and (2) at least one member selected from the group consisting of isopropyl alcohol, ethanol and methanol as the remainder.

Item 16. The cleaning composition according to item 1, which is characterized by use for cleaning at least one of a metal gate, a contact hole, a via hole and a capacitor.

Item 17. The cleaning composition according to item 1, which is characterized by use for removing a residual polymer derived from a resist.

Item 18. The cleaning composition according to item 1, which is characterized by use for cleaning after CMP.

Item 19. A method of cleaning a semiconductor substrate having at least one of a metal gate, a contact hole, a via hole and a capacitor formed thereon using a composition comprising (1) at least one of fluoride salts and hydrogendifluoride salts; (2) an organic solvent having a hetero atom or atoms; and (3) water.

Item 20. A method of removing a polymer derived from a resist remaining on an article after etching or after ion implantation using a composition comprising (1) at least one of fluoride salts and hydrogendifluoride salts; (2) an organic solvent having a hetero atom or atoms; and (3) water.

Item 21. A method of producing a semiconductor device, comprising the steps of: forming a resist pattern on a work layer consisting of an electroconductive layer on an insulating layer over a semiconductor substrate composed of silicon; forming the work layer into a specified pattern by dry-etching using the resist as a mask; and cleaning the semiconductor substrate using a composition comprising (1) at least one of fluoride salts and hydrogendifluoride salts; (2) an organic solvent having a hetero atom or atoms; and (3) water.

Item 22. A method of producing a semiconductor device, comprising the steps of: forming a specified pattern of an electroconductive layer over a semiconductor substrate composed of silicon; forming an insulating layer on the electroconductive layer; forming a resist pattern on a work layer consisting of an insulating layer; forming the work layer into a specified pattern by dry-etching using the resist as a mask; and cleaning the semiconductor substrate using a composition comprising (1) at least one of fluoride salts and hydrogendifluoride salts; (2) an organic solvent having a hetero atom or atoms; and (3) water.

Item 23. A method of cleaning a treated surface after CMP treatment in a single damascene or dual damascene process, using a composition comprising (1) at least one of fluoride salts and hydrogendifluoride salts; (2) an organic solvent having a hetero atom or atoms; and (3) water.

Item 24. A method of producing a semiconductor device, comprising the steps of: forming a work layer comprising an electroconductive layer and an insulating layer coexisting on one surface of a semiconductor substrate by a single damascene or dual damascene; and cleaning the work layer using a composition comprising (1) at least one of fluoride salts and hydrogendifluoride salts; (2) an organic solvent having a hetero atom or atoms; and (3) water.

The composition of the present invention is characterized by comprising (1) at least one of fluoride salts and hydrogendifluoride salts; (2) an organic solvent having a hetero atom or atoms; and (3) water and can be used in cleaning a metal gate, a contact hole, a via hole, a capacitor or the like in the course of producing a semiconductor. This cleaning composition can be also used for removing a polymer remaining on a side wall of a contact hole, a via hole, a capacitor, a metal gate, a metal wiring and the like, for removing a resist residue after ion implantation, for removing a polymer remaining after dry etching in a single damascene or dual damascene process, or for cleaning after CMP in a single damascene or dual damascene process.

(1) A fluoride salt and a hydrogendifluoride salt to be added to the cleaning composition of the invention is preferably at least one of them prepared from hydrofluoric acid and at least one member selected from the group consisting of ammonia, hydroxylamines, aliphatic amines, aromatic amines, and aliphatic or aromatic quaternary ammonium salts.

Examples of the hydroxylamine for use in forming salts with hydrofluoric acid are hydroxylamine, N-methlhydroxylamine, N,N-dimethylhydroxylamine, N-ethylhydroxylamine, N,N-diethylhydroxylamine, N-propylhydroxylamine, N-phenylhydroxylamine and like hydroxylamines mono- or di-substituted with straight-chain or branched-chain alkyl of 1 to 4 carbon atoms or a phenyl group.

Examples of the aliphatic amine are methylamine, ethylamine, propylamine, isopropylamine, butylamine, hexylamine, octylamine, dimethylamine, diethylamine, dipropylamine, diisopropylamine, dibutylamine, trimethylamine, triethylamine, tripropylamine, triisopropylamine, tributylamine and like aliphatic amines mono-, di- or tri-substituted with straight-chain or branched-chain alkyl group of 1 to 8 carbon atoms; monofluoromethylamine, difluoromethylamine, trifluoromethylamine, perfluoroethylamine, perfluoropropylamine, perfluoroisopropylamine, perfluorobutylamine, perfluorohexylamine, perfluorooctylamine, di(perfluoromethyl)amine, di(perfluoroethyl)amine, di(perfluoropropyl)amine, di(perfluoroisopropyl)amine, di(perfluorobutyl)amine, tri(perfluoromethyl)amine, tri(perfluoroethyl)amine, tri(perfluoropropyl)amine, tri(perfluoroisopropyl)amine, tri(perfluorobutyl)amine and like aliphatic amines mono-, di- or tri-substituted with straight-chain or branched chain $C_{1-8}$ alkyl group containing at least one fluorine atom; monoethanolamine, ethylenediamine, 2-(2-aminoethylamino)ethanol, diethanolamine, 2-ethylaminoethanol, dimethylaminoethanol, ethyldiethanolamine, cyclohexylamine, dicyclohexylamine, etc.

Examples of the aromatic amine are aniline, N-methylaniline, N,N-dimethylaniline, benzylamine, dibenzylamine, N-methylbenzylamine, etc.

Examples of the aliphatic or aromatic quaternary ammonium salt are tetramethylammonium, tetraethylammonium, tetrapropylammonium, tetraisopropylammonium, tetrabutylammonium, trimethyl(2-hydroxyethyl)ammonium, tetraphenylammonium and like aliphatic or aromatic quaternary ammonium hydrochlorides, hydrobromides, sulfates, nitrates and like mineral acid salts.

The hydrofluoride to be used in the invention is a 1:1 salt of hydrofluoric acid (HF) with ammonia, hydroxylamines, aliphatic amines or aromatic amines, or is hydrofluoride salt of aliphatic or aromatic quaternary ammonium. Preferred hydrofluorides include a fluoride salt represented by $NR'_4F$ (wherein R's are the same or different and each is a hydrocarbon group which may be substituted with a fluorine atom or atoms; or a hydrogen atom). Specific preferred examples of the fluoride salt represented by $NR'_4F$ include a fluoride salt represented by $NR_4F$ (wherein Rs are the same or different and each is a straight-chain or branched-chain alkyl group having 1 to 12 carbon atoms, preferably 1 to 4 carbon atoms which may be substituted with a fluorine atom or atoms; a phenyl group which may be substituted with a fluorine atom or atoms; or a hydrogen atom).

The hydrogendifluoride salt to be used in the invention is a 1:2 salt of hydrofluoric acid (HF) with ammonia, hydroxylamine, aliphatic amine or aromatic amine, or is hydrofluoric acid salt of aliphatic or aromatic quaternary ammonium. Preferred hydrofluoride salts include a hydrogendifluoride salt represented by $NR'_4HF_2$ (wherein R's are the same or different and each is a hydrocarbon group which may be substituted with a fluorine atom or atoms; or a hydrogen atom). Preferred examples of the hydrogendifluoride salt represented by $NR'_4HF_2$ include a hydrogendifluoride salt represented by $NR_4HF_2$ (wherein Rs are the same or different and each is a straight-chain or branched-chain alkyl group having 1 to 12 carbon atoms; preferably 1 to 4 carbon atoms which may be substituted with a fluorine atom or atoms; a phenyl group which may be substituted with a fluorine atom or atoms; or a hydrogen atom), and ammonium hydrogenfluoride is more preferable.

A hydrogendifluoride salt (such as ammonium hydrogendifluoride) to be added to the composition of the invention may be in the form of crystals or an aqueous solution of hydrogendifluoride salt (such as ammonium hydrogendifluoride). Alternatively, a stoichiometric amount of a fluoride salt (such as ammonium fluoride) and HF may be added to the composition to form a hydrogendifluoride salt (such as ammonium hydrogendifluoride).

The ammonium fluoride to be added to the composition of the invention may be in the form of crystals or an aqueous solution.

Examples of (2) the organic solvent having a hetero atom or atoms to be added to the composition of the invention are N,N-dimethylformamide, N,N-dimethylacetamide, dimethylsulfoxide, N-methyl-2-pyrrolidone, 1,3-dimethyl-2-imidazolidinone; methanol, ethanol, isopropyl alcohol (IPA), 1-propanol, 1-butanol, 2-butanol, t-butanol, 2-methyl-1-propanol, 1-pentanol, 1-hexanol, 1-heptanol, 4-heptanol, 1-octanol, 1-nonylalcohol, 1-decanol, 1-dodecanol and like alcohols; ethylene glycol, 1,2-propanediol, propylene glycol, 2,3-butanediol, glycerine and like polyols; acetone, acetylacetone, methyl ethyl ketone, 1,3-dihydroxyacetone and like ketones; acetonitrile, propionitrile, butyronitrile, isobutyronitrile, benzonitrile and like nitriles; formaldehyde, acetaldehyde, propionaldehyde and like aldehydes; ethylene glycol monomethyl ether, ethylene glycol monoethyl ether, diethylene glycol monobutyl ether and like alkylene glycol monoalkyl ethers; tetrahydrofuran, dioxane and like cyclic ethers; trifluoroethanol, pentafluoropropanol, 2,2,3,3-tetrafluoropropanol and like fluoroalcohols; sulfolane and nitromethane. More preferred are oxygen-containing organic solvents selected from alcohols and ketones. Preferred examples of such solvents are methanol, ethanol, n-propanol, isopropanol (IPA) and like alcohols, and acetone, methyl ethyl ketone, 1,3-dihydroxyacetone and like ketones. These organic solvents having a hetero atom or atoms can be used either alone or in combination.

When (2) the oxygen-containing organic solvent in the composition of the invention is at least one member selected from the group consisting of isopropyl alcohol, ethanol and methanol, preferably the concentration of water is 10% by mass or lower. When (2) the oxygen-containing organic solvent in the composition of the invention is acetone, the concentration of water is preferably 20 to 40% by mass.

When containing an alcohol as the solvent, usually the composition of the invention comprises (1) 0.001 to 1% by mass of at least one of fluoride salts and hydrogendifluoride salts, (2) 89 to 99.989% by mass of an alcohol and (3) 0.01 to 10% by mass of water, or preferably (1) 0.005 to 0.1% by mass of at least one of fluoride salts and hydrogendifluoride salts, (2) 89.99 to 99.985% by mass of an alcohol and (3) 0.01 to 10% by mass of water.

More specifically, a preferred composition of the invention comprises (1) a fluoride salt represented by $NR_4F$ (wherein Rs are the same or different and each is a straight-chain or branched-chain alkyl group having 1 to 12 carbon atoms, preferably 1 to 4 carbon atoms which may be substituted with a fluorine atom or atoms, a phenyl group which may be substituted with a fluorine atom or atoms, or a hydrogen atom) in a concentration of 1% by mass or lower and/or a hydrogendifluoride salt represented by $NR_4HF_2$ (wherein Rs are as defined above) in a concentration of 0.001 to 1% by mass; (3) water in a concentration of 10% by mass or lower; and (2) at least one member selected from the group consisting of isopropyl alcohol, ethanol and methanol as the remainder.

When containing a ketone as the solvent, usually the composition of the invention comprises (1) 0.001 to 1% by mass of at least one of fluoride salts and hydrogendifluoride salts, (2) 59 to 79.999% by mass of a ketone and (3) 20 to 40% by mass of water, or preferably (1) 0.005 to 0.1% by mass of at least one of fluoride salts and hydrogendifluoride salts, (2) 59.9 to 79.995% by mass of a ketone and (3) 20 to 40% by mass of water.

More specifically, a preferred composition of the invention comprises (1) a fluoride salt represented by $NR_4F$ (wherein Rs are the same or different and each is a straight-chain or branched-chain alkyl group having 1 to 12 carbon atoms, preferably 1 to 4 carbon atoms which may be substituted with a fluorine atom or atoms, a phenyl group which may be substituted with a fluorine atom or atoms, or a hydrogen atom) in a concentration of 1% by mass or lower and/or a hydrogendifluoride salt represented by $NR_4HF_2$ (wherein Rs are as defined above) in a concentration of 0.001 to 1% by mass; (3) water in a concentration of 20 to 40% by mass; and (2) acetone as the remainder.

The composition of the invention may further comprise (4) a surfactant. Useful surfactants are at least one of anionic, cationic and nonionic surfactants. Among them, an anionic surfactant is preferred.

Preferred anionic surfactants include those of carboxylic acid type, sulfonic acid type or sulfuric ester type wherein a hydrophilic group is —COOM, —$SO_3M$, or —$OSO_3M$ (wherein M is a hydrogen atom, ammonium or a metal atom) respectively. Useful salts are salts of alkali metals (such as sodium, potassium or the like) and like metal salts, ammonium salts, primary, secondary or tertiary amine salts and the like. Metal atoms may be monovalent or divalent. Among them, anionic surfactants of sulfonic acid type are preferred.

Useful surfactants of carboxylic acid type include, for example, $CF_3(CF_2)_aCOOH$, $(CF_3)_2CF(CF_2)_aCOOH$, $HCF_2(CF_2)_aCOOH$, $CF_3(CF_2)_a(CH_2)_bCOOH$, $CF_3(CF_2)_aCF=CH(CH_2)_bCOOH$, $Cl(CF_2CFCl)_pCF_2COOH$ {wherein a is an integer of 2 to 17, b is an integer of 1 or 2, and p is an integer of 1 to 9}, and their alkali metal salts, ammonium salts, primary amine salts, secondary amine salts, tertiary amine salts, etc.

Specific examples are $CF_3(CF_2)_aCOONa$, $(CF_3)_2CF(CF_2)_aCOONa$, $HCF_2(CF_2)_aCOONa$, $CF_3(CF_2)_a(CH_2)_bCOONa$, $CF_3(CF_2)_aCF=CH(CH_2)_bCOONa$, $Cl(CF_2CFCl)_pCF_2COONa$, etc.

Useful surfactants of sulfonic acid type include, for example, $C_cH_{2c+1}SO_3H$, $C_cH_{2c+1}O(CH_2CH_2O)_dSO_3H$ and $C_cH_{2c+1}$-ph-$SO_3H$ {wherein ph is a phenylene group, c is an integer of 5 to 20 and d is an integer of 0 to 20}; $C_nH_mC_6H_3(SO_3H)Oph(SO_3H)$ {wherein ph is a phenylene group, n is an integer of 1 to 30 and m is an integer of 3 to 61}, $C_nH_mOph(SO_3H)$ {wherein ph is a phenylene group, n is an integer of 1 to 30 and m is an integer of 3 to 61}; and their metal salts, ammonium salts, primary amine salts, secondary amine salts, tertiary amine salts, etc.

Specific examples are $C_{12}H_{25}O(CH_2CH_2O)_2SO_3Na$, $C_9H_{19}phO(CH_2CH_2O)_4SO_3Na$, $C_{12}H_{25}O(CH_2CH_2O)_4SO_3Na$, $C_6F_{11}phSO_3Na$, $C_9F_{19}OphSO_3Na$, $R''''CH=CH(CH_2)_jSO_3Na$ {wherein R'''' is $C_jH_m$, $C_jF_m$ or $C_jH_kF_l$, j is an integer of 0 to 30, m is an integer of 1 to 61, k is an integer of 1 to 60, and l is an integer of 1 to 60}, $C_{12}H_{25}OSO_3Na$, $C_{12}H_{25}phC_6H_3(SO_3H)Oph(SO_3H)$, etc.

It is preferable to use, among the anionic surfactants given above, a compound prepresented by $C_nH_mC_6H_3(SO_3H)Oph(SO_3H)$ {wherein ph is a phenylene group, n is an integer of 1 to 30 and m is an integer of 3 to 61} and a compound represented by $C_nH_mph(SO_3H)$ {wherein ph, n and m are as defined above} and their metal salts, ammonium salts, primary amine salts, secondary amine salts, tertiary amine salts, etc.

In the formula given above, the group represented by $C_nH_m$ is a group which meets the requirements that n is an integer of 1 to 30 and m is an integer of 3 to 61, such as a straight-chain or branched chain aliphatic alkyl group, an aliphatic alkenyl group having at least one double bond, an alicyclic alkyl group which may have a branched chain, an alicyclic alkenyl group which may have a branched chain, an aromatic alkyl group and the like.

Preferred nonionic surfactants are surfactants of polyethylene glycol type wherein a hydrophilic group is one represented by —$R'(CH_2CH_2O)_qR''$ or —$R'O(CH_2CH_2O)_qR''$ {wherein R'' is a hydrogen atom or an alkyl group having 1 to 10 carbon atoms, R' is a hydrocarbon group having 1 to 20 carbon atoms in which a hydrogen atom or atoms may be substituted with a fluorine atom or atoms, and q is an integer of 0 to 30}. Specific examples are as follows.

$C_9F_{17}O(CH_2CH_2O)_qCH_3$(q=0 to 30), $C_9H_{19}ph(CH_2CH_2O)_{10}H$, $C_{12}H_{25}O(CH_2CH_2O)_9H$, $C_9H_{19}phO(CH_2CH_2O)_{10}H$, $C_9H_{19}phO(CH_2CH_2O)_5H$, $C_8H_{17}phO(CH_2CH_2O)_3H$, $C_8H_{17}ph(CH_2CH_2O)_{10}H$ {wherein ph is a phenylene group}, etc.

Examples of the cationic surfactants include primary amine represented by $R'''NH_2$, secondary amine represented by $R'''_2NH$, tertiary amine represented by $R'''_3N$, and tetraamine represented by $[R'''_4N]M'$ (wherein R'''s are the same or different and each represents a straight chain or branched chain alkyl group of 1 to 30 carbon atoms which may be substituted with a fluorine atom or atoms or a OH group or groups, or a phenyl group which may be substituted with a fluorine atom or atoms or a OH group or groups, or a hydrogen atom, and M' is a monovalent anion (e.g. $Cl^-$). Specific examples of the compound are:

$CH_3(CH_2)_nNH_2$, $(CH_3(CH_2)_n)_2NH$, $(CH_3(CH_2)_n)_3N$, $(CH_3(CH_2)_n)_4NCl$, $CH_3(CH_2)_nN((CH_2)_nOH)_2$, $CF_3(CF_2)_nNH_2$, $(CF_3(CF_2)_n)_2NH$, $(CF_3(CF_2)_n)_3N$, $(CF_3(CF_2)_n)_4NCl$, $CF_3(CF_2)_nN((CH_2)_nOH)_2$, $C_6H_5NH_2$, and $(CH_3)_2(CH_2)_nNH_2$, (wherein n is an integer of 1 to 30).

The content of the surfactant is not limited insofar as the contemplated effect of the invention can be achieved. Usually it is about 0.0001 to about 10% by mass, preferably about 0.001 to about 5% by mass, more preferably about 0.01 to about 1% by mass.

When an anionic surfactant is used, the content is preferably 0.001 to 10% by mass.

When the composition of the invention contains an anionic surfactant, the content of water is preferably 60% by mass or lower.

When the composition of the invention contains an anionic surfactant, usually the composition of the invention comprises (1) 0.001 to 1% by mass of at least one of fluoride salts and hydrogendifluoride salts, (2) 29 to 99.988% by mass of an organic solvent having a hetero atom or atoms, (3) 0.01 to 60% by mass of water, and (4) 0.001 to 10% by mass of an anionic surfactant, or preferably (1) 0.005 to 1% by mass of at least one of fluoride salts and hydrogendifluoride salts, (2) 58.0 to 99.975% by mass of an organic solvent having a hetro atom or atoms, (3) 0.01 to 40% by mass of water and (4) 0.01 to 1% by mass of an anionic surfactant.

More specifically, a preferred polymer-removing composition of the invention comprises (1) a fluoride salt represented by $NR_4F$ (wherein Rs are the same or different and each is a straight-chain or branched-chain alkyl group having 1 to 12 carbon atoms, preferably 1 to 4 carbon atoms which may be substituted with a fluorine atom or atoms, a phenyl group which may be substituted with a fluorine atom or atoms, or a hydrogen atom) in a concentration of 1% by mass or lower and/or a hydrogendifluoride salt represented by $NR_4HF_2$ (wherein Rs are as defined above) in a concentration of 0.001 to 1% by mass; (3) water in a concentration of 60% by mass or lower; (4) an anionic surfactant in a concentration of 0.001 to 10% by mass; and (2) at least one member selected from the group consisting of isopropyl alcohol, ethanol and methanol as the remainder.

The composition of the invention may further comprise (5) a corrosion inhibitor. Examples of the corrosion inhibitor are catechol, pyrogallol, oxine and like aromatic hydroxy compounds, benzotriazole, tolyltriazole and like triazole compounds and derivatives thereof, phthalic acid, salicylic acid, azelaic acid and like carboxyl-containing organic compounds, ethylenediaminetetraacetic acid and like aminopolycarboxylic acids, 1,2-propaneaminetetramethylenephosphonic acid, and like phosphonic acids, cupferron and like chelating agents, pyridine derivatives, sodium 2-mercaptobenzothiazole and like thiazole compounds, tetramethylammonium formate and like tatraammonium salts, sorbitol, arabitol, amylose, and like saccharides and derivatives thereof. The content of the corrosion inhibitor is not limited insofar as the intended effect of the invention is achieved. It is about 0.01 to about 30% by mass, preferably about 0.5 to about 10% by mass.

The composition of the invention comprising (1) at least one of fluoride salts and hydrogendifluoride salts; (2) an organic solvent having a hetero atom or atoms; and (3) water has a THOX or BPSG etch rate at 25° C. of 100 Å/min or lower, preferably 80 Å/min or lower, more preferably 60 Å/min or lower, still more preferably 50 Å/min or lower.

The composition of the invention shows a low property of corroding metals and a substrate of Al, Al—Cu, Cu, W, Al—Si, Al—Si—Cu or the like which are likely to become corroded. Further the composition of the invention exhibits an excellent cleaning ability in treating, at a low temperature for a short time, a polymer derived from a resist, a native oxide and contaminants such as organic substances and particles produced in the process of producing a semiconductor.

Consequently the composition of the invention can be used for cleaning at least one of metal gate, a contact hole, a via hole and a capacitor in the course of producing semiconductors even when a material for a gate electrode contains a metal.

In the present invention, cleaning is performed on a substrate at an intermediate stage in the process of manufacturing semiconductors. For example, cleaning is carried out before embedding metal parts after forming a contact hole.

Stated more specifically, the composition of the invention can be used in the process of manufacturing semiconductors, namely in the following steps. A resist pattern is formed on a work layer consisting of an electroconductive layer formed on an insulating layer over a substrate of silicon, i.e. a semiconductor substrate. Then the work layer is formed into specified pattern by dry-etching using the resist as a mask. Thereafter the obtained semiconductor substrate is cleaned with the composition. In these steps, for example, a metal gate and a metal wiring are formed on the semiconductor substrate.

Further the composition of the invention can be used in the process of manufacturing semiconductors, namely in the following steps. A resist pattern is formed on a work layer consisting of an insulating layer formed on electroconductive layer over a substrate of silicon, i.e. a semiconductor substrate. Then the work layer is formed into specified pattern by dry-etching using the resist as a mask. Thereafter the obtained semiconductor substrate is cleaned with the composition. In these steps, for example, a via hole and a contact hole are formed on the semiconductor substrate. These steps correspond with dry etching step in a single damascene or dual damascene process.

In cleaning a metal gate, a contact hole, a via hole and a capacitor with the cleaning composition of the invention, for example, an article to be treated (such as a semiconductor substrate having at least one of a metal gate, a contact hole, a via hole and a capacitor formed thereon) is immersed in the composition and treated, for example, at about 15 to about 40° C., preferably approximately at room temperature for about 0.5 to about 30 minutes. The cleaning can be performed by bringing the cleaning composition into contact with the article to be treated. For example, the article to be treated can be cleaned by supplying the composition onto the article while rotating it, by continuously spraying the composition over the article, or by immersing the article in the composition.

The semiconductor substrate cleaned with the composition of the invention can be processed into various kinds of semiconductor devices by conventional methods (such as the method disclosed in Atlas of IC Technologies: An Introduction to VLSI Processes by W. Maly, 1987 by The Benjamin/Cummings Publishing Company Inc.).

The composition of the invention shows a low property of corroding a metal and a substrate of Al, Al—Cu, Cu, W, Al—Si, Al—Si—Cu or the like which are likely to become corroded. Further the composition of the invention exhibits a high cleaning ability in treating, at a low temperature for a short time, a polymer derived from a resist or the like. Accordingly the cleaning composition of the invention can be used for removing a polymer for a resist remaining on a side wall of a via hole, a metal gate, a contact hole, a capacity or the like, namely can be used as a composition for removing such polymer. The present invention also includes such composition for removing a polymer.

The polymer-removing composition of the invention can be used also for removing the polymer remaining after forming a metal gate, a contact hole, a via hole, a capacitor or a $n^+$ or $p^+$ region or for removing the polymer remaining after dry etching in a single damascene or dual damascene process.

The polymer can be removed with the composition of the invention by immersing an article to be treated (e.g., a semiconductor substrate having formed thereon at least one of via hole, metal gate, contact hole and capacitor) in the composition for treatment, e.g. at about 15 to about 40° C., preferably approximately at room temperature for about 0.5 to about 30 minutes. In this case, the polymer can be removed by bringing the composition into contact with the article to be treated. For example, the article may be cleaned by supplying the composition onto the article while rotating it, or by continuously spraying the composition over the article.

Preferably the composition of the invention is used for removing a polymer remaining on a semiconductor substrate having a fine pattern (e.g. a pattern having a gap of about 0.0001 to about 10 µm).

After a polymer has been removed from the semiconductor substrate with the composition of the invention, the semiconductor substrate can be processed into various kinds of semiconductor devices by conventional methods (e.g., the method disclosed in Atlas of IC Technologies: An Introduction to VLSI Processes by W. Maly, 1987 by The Benjamin/Cummings Publishing Company Inc.).

The cleaning composition of the invention (especially polymer-removing composition) can be advantageously used for resists (including a negative type resist and a positive type resist) which can be developed using an aqueous solution of alkali. The foregoing resists include (i) a positive type resist comprising naphthoquinonediazide compound and novolak resin; (ii) a positive type resist comprising a compound which generates an acid by exposure to light, a compound which decomposes due to an acid and which is thereby increased in the solubility in an aqueous solution of alkali, and an alkali-soluble resin; (iii) a positive type resist comprising a compound which generates an acid by exposure to light, and an alkali-soluble resin having a group which decomposes due to an acid and which is thereby increased in the solubility in an aqueous solution of alkali; and (iv) a negative type resist comprising a compound which generates an acid by exposure to light, a crosslinking agent and an alkali-soluble resin. However, the foregoing resists are not limited thereto.

After etching, a polymer derived from the residual resist may be cleaned or removed with the composition of the invention after or without ashing.

The cleaning composition and the polymer-removing composition according to the invention can be used in the course of producing liquid crystal panel devices as well as in the course of producing semiconductors.

In the course of producing semiconductors, cleaning is required for removing an abrasive material from the surface of the substrate after CMP in a single damascene or dual damascene process. Using the cleaning composition of the invention, the abrasive material remaining on the surface of the substrate can be removed with a brush or the like after CMP. Accordingly the cleaning composition of the invention can be used for cleaning the surface of the substrate after CMP in the course of producing semiconductors.

The article to be treated is cleaned with the composition of the invention after CMP, for example, by immersing the article in the composition at about 15 to about 40° C., preferably approximately at room temperature for about 0.1 to about 30 minutes or by allowing the composition to flow over the article at about 15 to about 40° C., preferably approximately at room temperature for about 1 second to about 10 minutes. Although a brush need not be used in the cleaning step, the slurry can be removed with higher efficiency by use of a brush. Thus, the use of a brush is preferable. The article may be cleaned after CMP by its immersion in the composition for ultrasonic cleaning (megasonic cleaning).

The foregoing cleaning can be performed after CMP on a work layer consisting of an electroconductive layer and an insulating layer coexisting on one surface of a semiconductor substrate or a work layer consisting of an electroconductive layer thereon, for example, after CMP in single damascene process or dual damascene process for forming a plug or wiring.

The damascene process may be also carried out, for example, in the course of producing liquid crystal panel devices. The composition of the invention can be used in cleaning the article after CMP in a single damascene process or dual damascene process during the manufacture of such elements.

This invention includes a method of producing a semiconductor device, comprising the steps of: forming a work layer consisting an electroconductive layer and an insulating layer coexisting on one surface of a semiconductor substrate by a single damascene or dual damascene; and cleaning the work layer using the cleaning composition of the invention.

The semiconductor substrate cleaned with the cleaning composition of the invention after CMP can be processed into various kinds of semiconductor devices by conventional methods (such as the method disclosed in Atlas of IC Technologies: An Introduction to VLSI Processes by W. Maly, 1987 by The Benjamin/Cummings Publishing Company Inc.).

BEST MODE FOR CARRYING OUT THE INVENTION

The present invention will be described in more detail with reference to the following examples to which, however, the invention is not limited.

The etch rate of each oxide film was determined by measuring the thickness of the films before and after etching with an Auto EL-III ellipsometer manufactured by Rudolf Research. The etch rates of the following compositions were calculated as the difference in thickness of a film before and after being etched at 25° C. divided by etch time.

EXAMPLES 1 TO 8 AND COMPARATIVE EXAMPLES 1 TO 5

The compositions having the formulations shown below were prepared by the conventional method.

Example 1: $NH_4 \cdot HF_2$ (0.01 wt %), water (0.3 wt %) and IPA as the remainder;
Example 2: $NH_4 \cdot HF_2$ (0.085 wt %), water (0.3 wt %) and IPA as the remainder;
Example 3: $NH_4 \cdot HF_2$ (0.01 wt %), $NH_4F$ (0.065 wt %), water (7.5 wt %) and IPA as the remainder;
Example 4: $(CH_3)_4N \cdot HF_2$ (0.3 wt %), water (7.5 wt %) and IPA as the remainder;
Example 5: $C_8H_{17}NH_3 \cdot HF_2$ (0.5 wt %), water (7.5 wt %) and IPA as the remainder;
Example 6: $NH_4 \cdot HF_2$ (0.085 wt %), $NH_4F$ (0.11 wt %), water (7.5 wt %) and MeOH as the remainder;
Example 7: $NH_4 \cdot HF_2$ (0.085 wt %), $NH_4F$ (0.11 wt %), water (7.5 wt %) and EtOH as the remainder;
Example 8: $NH_4 \cdot HF_2$ (0.04 wt %), $NH_4F$ (0.10 wt %), water (3.5 wt %) and acetone as the remainder;
Comparative Example 1: HF (5 wt %), water (5 wt %) and acetone as the remainder;
Comparative Example 2: HF (5 wt %), water (5 wt %) and IPA as the remainder;

Comparative Example 3: Aqueous ammonia (0.29 wt %);
Comparative Example 4: Fluoric acid (0.5 wt %);
Comparative Example 5: HF (0.125 wt %), NH$_4$F (40 wt %), and water as the remainder.

Test Example 1

Metal Corrosion Test I (without a Surfactant)

A Cu test piece, an Al wafer, and a W wafer (each 3 cm×3 cm) were separately immersed in 220 g of the composition at 22° C. for 10 minutes. Then, the concentrations of Cu, Al and W dissolved out in the composition were measured with ICP-MS and an etch rate was calculated. The results are shown in Table 1.

TABLE 1

| Composition | Al (Å/min) | Cu (Å/min) | W (Å/min) |
| --- | --- | --- | --- |
| Example 1 | 0.1 or lower | 0.1 or lower | 0.1 or lower |
| Example 2 | 0.1 or lower | 0.1 or lower | 0.1 or lower |
| Example 3 | 0.1 or lower | 0.1 or lower | 0.1 or lower |
| Example 4 | 0.1 or lower | 0.1 or lower | 0.1 or lower |
| Example 5 | 0.1 or lower | 0.1 or lower | 0.1 or lower |
| Example 6 | 0.1 or lower | 0.1 or lower | 0.1 or lower |
| Example 7 | 0.1 or lower | 0.1 or lower | 0.1 or lower |
| Example 8 | 0.1 or lower | 0.1 or lower | 0.1 or lower |
| Comp. Ex. 1 | 3.0 | 2.0 | 0.21 |
| Comp. Ex. 2 | 7.1 | 3.2 | 0.14 |
| Comp. Ex. 3 | 110 | 9.2 | 0.33 |
| Comp. Ex. 4 | 330 | 14 | 0.98 |

Test Example 2

Metal Corrosion Test II (without a Surfactant)

In the composition of Example 1 (NH$_4$.HF$_2$ (0.01 wt %), water (0.3 wt %) and IPA as the remainder), the concentration of NH$_4$.HF$_2$ was maintained at 0.01 wt %, and the proportions of water and IPA were changed as shown in Table 2 (only the amount of water was shown and the remainder was IPA). Under the same conditions as in Test Example 1, the concentrations of Cu, Al and W dissolved out in the composition were measured with ICP-MS, and an etch rate was calculated. The results are shown in Table 2.

TABLE 2

| Water conc. (wt %) | Al (Å/min) | Cu (Å/min) | W (Å/min) |
| --- | --- | --- | --- |
| 0.3 | 0.1 or lower | 0.1 or lower | 0.1 or lower |
| 2.5 | 0.1 or lower | 0.1 or lower | 0.1 or lower |
| 5 | 0.1 or lower | 0.1 or lower | 0.1 or lower |
| 10 | 0.1 or lower | 0.1 or lower | 0.1 or lower |
| 20 | 0.1 or lower | 0.1 or lower | 0.35 |
| 30 | 5 | 0.29 | 2.3 |
| 50 | 30 | 0.59 | 3.2 |
| 70 | 43 | 2.8 | 5.4 |

Test Example 3

Metal Corrosion Test III (without a Surfactant)

In the composition containing acetone as a solvent (NH$_4$.HF$_2$ (0.04 wt %), water and acetone as the remainder), the concentration of NH$_4$.HF$_2$ was maintained at 0.04 wt %, and the proportions of water and IPA were changed as shown in Table 3 (only the amount of water was shown and the remainder was IPA). Under the same conditions as in Test Example 1, the concentrations of Cu, Al and W dissolved out in the composition were measured with ICP-MS, and an etch rate was calculated. The results are shown in Table 3.

TABLE 3

| Water conc. (wt %) | Al (Å/min) | Cu (Å/min) | W (Å/min) |
| --- | --- | --- | --- |
| 0.01 | 4.3 | 1.0 | 0.1 or lower |
| 10 | 2.5 | 0.31 | 0.1 or lower |
| 20 | 1.2 | 0.36 | 0.1 or lower |
| 30 | 1.1 | 0.1 or lower | 0.1 or lower |
| 40 | 1.1 | 0.1 or lower | 0.1 or lower |
| 50 | 50 | 0.40 | 0.39 |
| 60 | 47 | 1.0 | 0.24 |
| 70 | 46 | 2.9 | 0.21 |
| 80 | 44 | 6.5 | 0.31 |
| 90 | 44 | 9.6 | 0.30 |
| 100 | 46 | 8.9 | 0.47 |

Test Example 4

Metal Corrosion Test IV (without a Surfactant)

Using the compositions of Example 1 and Comparative Example 5, a corrosion test was conducted in the same manner as in Test Example 1 using TiN wafer, CoSi wafer, W wafer and TiSi wafer (each 3 cm×3 cm). The results are shown in Table 4.

TABLE 4

| Composition | TiN (Å/min) | CoSi (Å/min) | W (Å/min) | TiSi (Å/min) |
| --- | --- | --- | --- | --- |
| Example 1 | 0.001 | 0.001 or lower | 0.001 or lower | 0.001 or lower |
| Comp. Ex. 5 | 0.01 | 0.049 | 0.014 | 0.085 |

It is apparent from the results of Test Examples 1 to 4 that the compositions of this invention have a low capability of corroding a metal, can be used as a cleaning composition for a metal gate, a contact hole, a via hole, a capacitor or the like and can be preferably used as a polymer-removing composition or as a cleaning composition to be employed after CMP.

For use as a cleaning composition for cleaning a contact hole or the like or as a polymer-removing composition, the composition needs to have, e.g., a property of cleaning a polymer derived from a resist remaining on a side wall of contact hole. Consequently Test Examples 5 and 6 were carried out to investigate whether the composition has this property.

Test Example 5

Polymer-Cleaning Ability Test I (Without a Surfactant)

A resist pattern was formed in the conventional manner, the pattern comprising a positive type photo-resist of naphthoquinone/novolak resin on a silicon wafer having an Al wiring layer (comprising three layers, i.e., Ti/TiN layer-Al layer-Ti/TiN layer) deposited thereon. The silicon wafer having the resist pattern was subjected to dry-etching of metal according to the conventional method. Then, the remaining resist was removed by ashing with an oxygen gas.

The obtained silicon wafer having metal wiring on the surface was immersed in each of the compositions of Examples 1 to 8 and Comparative Examples 1 to 4 at 25° C. for 10 minutes for removal of the polymer. The wafer thus treated was rinsed with pure water. The results of cleaning the ashing residue on the silicon wafer (polymeric deposits) and the occurrence or non-occurrence of corrosion of wiring metal were evaluated by SEM (scanning electron microscope) photographic observation. The results of cleaning the polymeric deposits were rated as "good" or as "incomplete" (2-level rating). The occurrence or non-occurrence of corrosion of wiring metal was rated as "corroded" or "none" (2-level rating). The results are shown in Table 5.

TABLE 5

| Composition | Results of cleaning deposits | Occurrence or non-occurrence of corrosion of wiring metal |
| --- | --- | --- |
| Example 1 | Good | None |
| Example 2 | Good | None |
| Example 3 | Good | None |
| Example 4 | Good | None |
| Example 5 | Good | None |
| Example 6 | Good | None |
| Example 7 | Good | None |
| Example 8 | Good | None |
| Comp. Example 1 | Good | Corroded |
| Comp. Example 2 | Good | Corroded |
| Comp. Example 3 | Good | Corroded |
| Comp. Example 4 | Good | Corroded |

In Test Example 5, Al wiring was formed before the test. If the Al wiring can be cleaned, the composition can be used for cleaning a polymer of other metal materials.

Test Example 6

Polymer-Cleaning Ability Test II (Without a Surfactant)

A resist pattern was formed in the conventional manner, the pattern comprising a positive type photo-resist of naphthoquinone/novolak resin on a silicon wafer having an interlayer dielectric on its surface and an Al wiring layer (comprising three layers, i.e., Ti/TiN layer-Al layer-Ti/TiN layer) under the interlayer dielectric. The silicon wafer having the resist pattern was subjected to dry-etching of oxide film according to the conventional method to form a via hole. Then, the remaining resist was removed by ashing with an oxygen gas.

The obtained silicon wafer having the via hole was immersed in each of the compositions of Examples 1 to 8 and Comparative Examples 1 to 4 at 25° C. for 10 minutes for removal of the polymer deposits. The wafer thus treated was rinsed with pure water. The results of cleaning the ashing residue on the silicon wafer (polymeric deposits) and the occurrence or non-occurrence of corrosion of wiring metal were evaluated by SEM (scanning electron microscope) photographic observation. The results of cleaning the polymeric deposits were rated as "good" or as "incomplete" (2-level rating) The occurrence or non-occurrence of corrosion of wiring metal was rated as "corroded" or "none" (2-level rating). The results are shown in Table 6.

TABLE 6

| Composition | Results of cleaning deposits | Occurrence or non-occurrence of corrosion of wiring metal |
| --- | --- | --- |
| Example 1 | Good | None |
| Example 2 | Good | None |
| Example 3 | Good | None |

TABLE 6-continued

| Composition | Results of cleaning deposits | Occurrence or non-occurrence of corrosion of wiring metal |
| --- | --- | --- |
| Example 4 | Good | None |
| Example 5 | Good | None |
| Example 6 | Good | None |
| Example 7 | Good | None |
| Example 8 | Good | None |
| Comp. Example 1 | Good | Corroded |
| Comp. Example 2 | Good | Corroded |
| Comp. Example 3 | Good | Corroded |
| Comp. Example 4 | Good | Corroded |

In Test Example 6, a via hole was formed before the test. If the deposits of via hole can be cleaned, the composition can be used for cleaning the deposits of contact hole.

It is clear from the results of Test Examples 5 and 6 that the composition of the invention has a capability of cleaning the polymer (resist) and shows a property of scarcely corroding wiring metal. Thus it is evident that the composition of the invention is suitable as a composition for cleaning a metal gate, a contact hole, a via hole, a capacitor and the like. It is also clear that the cleaning composition of the invention can be suitably used for removing a polymer remaining on a side wall of a metal gate, a contact hole, a via hole, a capacitor and the like.

Test Example 7

Etch Rate of Insulating Layer (Without a Surfactant)

Using the compositions of Examples 1 to 8 and Comparative Examples 1 to 4, an etch rate of each film was determined by etching at 25° C. a test substrate having a thermal oxide film, a BPSG film or an NSG film formed on the surface of a silicon substrate. The results are shown in Table 7. The etch rate in the table is shown as Å/min.

TABLE 7

| Composition | Thermal oxide film | BPSG film | NSG film |
| --- | --- | --- | --- |
| Example 1 | 10 | 10 | 10 |
| Example 2 | 20 | 20 | 20 |
| Example 3 | 1.6 | 15 | 12 |
| Example 4 | 2.0 | 4.1 | 3.5 |
| Example 5 | 3.9 | 8.5 | 7.0 |
| Example 6 | 1.3 | 23 | 11 |
| Example 7 | 4.8 | 35 | 24 |
| Example 8 | 0.5 | 8 | 16 |
| Comp. Ex. 1 | 3 | 250 | 3.6 |
| Comp. Ex. 2 | 6 | 330 | 11 |
| Comp. Ex. 3 | — | — | — |
| Comp. Ex. 4 | 30 | 260 | 45 |

It is difficult to measure the etch rate of a native oxide because it is very thin. As clear from Test Example 7, an oxide film such as a thermal oxide film, BPSG film and NSG film which are thicker than a native oxide can be etched. Accordingly it is evident that a native oxide which is thinner than these films can be etched and can be removed (cleaned). It is apparent from Test Examples 1 to 7 that the composition of the invention shows a lower property of corroding metals than cleaning compositions conventionally used and can clean a native oxide, polymeric deposits and the like. Such composition can be suitably used as a composition for cleaning a metal gate, a contact hole, a via hole, a capacitor and the like.

The results of Table 7 show that the composition of the invention can remove a polymer adhering to a thermal oxide film, BPSG film, NSG film and like films without significantly deforming a via hole. It is apparent from Test Examples 1 to 7 that the composition of the invention shows a lower property of corroding metals than polymer-removing compositions conventionally used and can remove a polymer (deposit) without significantly deforming a via hole. Consequently such composition can be suitably used as a composition for removal of a polymer remaining on a side wall of a metal gate, a contact hole, a via hole, a capacitor, a metal wiring and the like and as a composition for removal of resist residue after ion implantation or for removal of a polymer adhered by dry etching in a single damascene or dual damascene process.

The slurry used in CMP may adhere to the surface of the article to be treated or may become partly lodged in an insulating layer to be treated when the layer is polished. In this situation, the slurry is usually lifted off by slightly etching the insulating layer and is scrubbed off with a brush. It is clear from Test Example 7 that the foregoing films can be etched with the cleaning composition of the invention. Thus the slurry can be removed (cleaned) when the composition of the invention is used as a cleaning composition after CMP. The composition of the invention exhibits a low property of corroding a metal and can remove a slurry so that it is suitable for use as a cleaning composition after CMP.

Compositions containing an anionic surfactant were prepared and the following tests were carried out.

EXAMPLES 9 TO 28 AND COMPARATIVE EXAMPLES 6 AND 7

Compositions having the following formulations were prepared by the conventional method.

Example 9: $C_{12}H_{25}C_6H_3(SO_3H)Oph(SO_3H)$ (0.15%)! $NH_4F$ (0.22%) water (7.5%) and IPA as the remainder;
Example 10: $C_{12}H_{25}C_6H_3(SO_3H)Oph(SO_3H)$ (0.15%), $NH_4F$ (0.185%) water (15%) and IPA as the remainder;
Example 11: $C_{12}H_{25}C_6H_3(SO_3H)Oph(SO_3H)$ (0.15%), $NH_4F$ (0.185%) water (20%) and IPA as the remainder;
Example 12: $C_{12}H_{25}C_6H_3(SO_3H)Oph(SO_3H)$ (0.15%), $NH_4F$ (0.185%) water (25%) and IPA as the remainder;
Example 13: $C_{12}H_{25}C_6H_3(SO_3H)Oph(SO_3H)$ (0.15%), $NH_4F$ (0.185%) water (30%) and IPA as the remainder;
Example 14: $C_{12}H_{25}C_6H_3(SO_3H)Oph(SO_3H)$ (0.15%), $NH_4F$ (0.093%) water (7.5%) and IPA as the remainder;
Example 15: $C_{12}H_{25}C_6H_3(SO_3H)Oph(SO_3H)$ (0.15%), $NH_4F$ (0.093%) water (15%) and IPA as the remainder;
Example 16: $C_{12}H_{25}C_6H_3(SO_3H)Oph(SO_3H)$ (0.15%), $NH_4F$ (0.093%) water (20%) and IPA as the remainder;
Example 17: $C_{12}H_{25}C_6H_3(SO_3H)Oph(SO_3H)$ (0.15%), $NH_4F$ (0.093%) water (25%) and IPA as the remainder;
Example 18: $C_{12}H_{25}C_6H_3(SO_3H)Oph(SO_3H)$ (0.15%), $NH_4F$ (0.093%) water (30%) and IPA as the remainder;
Example 19: $C_{12}H_{25}C_6H_3(SO_3H)Oph(SO_3H)$ (0.075%), $NH_4F$ (0.185%) water (7.5%) and IPA as the remainder;
Example 20: $C_{12}H_{25}C_6H_3(SO_3H)Oph(SO_3H)$ (0.075%), $NH_4F$ (0.185%) water (15%) and IPA as the remainder;
Example 21: $C_{12}H_{25}C_6H_3(SO_3H)Oph(SO_3H)$ (0.075%), $NH_4F$ (0.185%) water (20%) and IPA as the remainder;
Example 22: $C_{12}H_{25}C_6H_3(SO_3H)Oph(SO_3H)$ (0.075%), $NH_4F$ (0.185%) water (25%) and IPA as the remainder;
Example 23: $C_{12}H_{25}C_6H_3(SO_3H)Oph(SO_3H)$ (0.075%), $NH_4F$ (0.185%) water (30%) and IPA as the remainder;
Example 24: $C_{12}H_{25}C_6H_3(SO_3H)Oph(SO_3H)$ (0.075%), $NH_4F$ (0.093%) water (7.5%) and IPA as the remainder;
Example 25: $C_{12}H_{25}C_6H_3(SO_3H)Oph(SO_3H)$ (0.075%), $NH_4F$ (0.093%) water (15%) and IPA as the remainder;
Example 26: $C_{12}H_{25}C_6H_3(SO_3H)Oph(SO_3H)$ (0.075%), NH4F (0.093%) water (20%) and IPA as the remainder;
Example 27: $C_{12}H_{25}C_6H_3(SO_3H)Oph(SO_3H)$ (0.075%), $NH_4F$ (0.093%) water (25%) and IPA as the remainder;
Example 28: $C_{12}H_{25}C_6H_3(SO_3H)Oph(SO_3H)$ (0.075%), $NH_4F$ (0.093%) water (30%) and IPA as the remainder;
Comparative Example 6: $C_9H_{19}phO(CH_2CH_2O)_{10}H$ (0.15%), $NH_4HF_2$ (0.01%), $NH_4F$ (0.065%), water (7.5%) and IPA as the remainder;
Comparative Example 7: $NH_4F$ (0.055%), water (10%) and IPA as the remainder;

Test Example 8

Metal Corrosion Test V (with a Surfactant)

A Cu test piece, an Al wafer, and a W wafer (each 3 cm×3 cm) were separately immersed in 100 g of each of the compositions of Examples 9 to 28 and Comparative Examples 6 and 7 at 22° C. for 30 minutes. Then, the concentrations of Cu, Al and W dissolved out in the composition were measured with ICP-MS and an etch rate was calculated. The results are shown in Table 8.

TABLE 8

| Composition | Al (Å/min) | Cu (Å/min) | W (Å/min) |
| --- | --- | --- | --- |
| Example 9 | 0.1 or lower | 0.1 or lower | 0.1 or lower |
| Example 10 | 0.1 or lower | 0.1 or lower | 0.1 or lower |
| Example 11 | 0.1 or lower | 0.1 or lower | 0.1 or lower |
| Example 12 | 0.1 or lower | 0.1 or lower | 0.1 or lower |
| Example 13 | 0.1 or lower | 0.1 or lower | 0.1 or lower |
| Example 14 | 0.1 or lower | 0.1 or lower | 0.1 or lower |
| Example 15 | 0.1 or lower | 0.1 or lower | 0.1 or lower |
| Example 16 | 0.1 or lower | 0.1 or lower | 0.1 or lower |
| Example 17 | 0.1 or lower | 0.1 or lower | 0.1 or lower |
| Example 18 | 0.1 or lower | 0.1 or lower | 0.1 or lower |
| Example 19 | 0.1 or lower | 0.1 or lower | 0.1 or lower |
| Example 20 | 0.1 or lower | 0.1 or lower | 0.1 or lower |
| Example 21 | 0.1 or lower | 0.1 or lower | 0.1 or lower |
| Example 22 | 0.1 or lower | 0.1 or lower | 0.1 or lower |
| Example 23 | 0.1 or lower | 0.1 or lower | 0.1 or lower |
| Example 24 | 0.1 or lower | 0.1 or lower | 0.1 or lower |
| Example 25 | 0.1 or lower | 0.1 or lower | 0.1 or lower |
| Example 26 | 0.1 or lower | 0.1 or lower | 0.1 or lower |
| Example 27 | 0.1 or lower | 0.1 or lower | 0.1 or lower |
| Example 28 | 0.1 or lower | 0.1 or lower | 0.1 or lower |

It is apparent from the results of Table 8 that the composition of the invention shows a low property of corroding metals.

The results of Table 8 show that the composition of the invention has a low property of corroding metals, can be used as a composition for cleaning a metal gate, a contact hole, a via hole, a capacitor and the like, and can be preferably used as a polymer-removing composition and as a cleaning composition to be employed after CMP.

Such composition needs to have, in addition, a capability of removing a residual polymer (resist). Consequently Test Examples 9 and 10 were carried out to investigate whether the composition has this capability.

Test Example 9

Polymer-Removing Ability Test I (with a Surfactant)

A resist pattern was formed in the conventional manner, the pattern comprising a positive type photo-resist of naphthoquinone/novolak resin on a silicon wafer having an Al wiring layer (comprising three layers, i.e., Ti/TiN layer-Al layer-Ti/TiN layer) deposited thereon. The silicon wafer having the resist pattern was subjected to dry-etching of metal according to the conventional method. Then, the remaining resist was removed by ashing with an oxygen gas.

The obtained silicon wafer having metal wiring on the surface was immersed in each of the compositions of Examples 9 to 28 and Comparative Examples 6 and 7 at 25° C. for 10 minutes for removal of the polymer. The wafer thus treated was rinsed with pure water. The results of removing the ashing residue on the silicon wafers (polymeric deposits) and the occurrence or non-occurrence of corrosion of wiring metal were evaluated by SEM (scanning electron microscope) photographic observation. The results of removing polymeric deposits were rated as "good" or as "incomplete" (2-level rating). The occurrence or non-occurrence of corrosion of wiring metal was rated as "corroded" or "none" (2-level rating). The results are shown in Table 9.

TABLE 9

| Composition | Results of removing deposits | Occurrence or non-occurrence of corrosion of wiring metal |
|---|---|---|
| Example 9 | Good | None |
| Example 10 | Good | None |
| Example 11 | Good | None |
| Example 12 | Good | None |
| Example 13 | Good | None |
| Example 14 | Good | None |
| Example 15 | Good | None |
| Example 16 | Good | None |
| Example 17 | Good | None |
| Example 18 | Good | None |
| Example 19 | Good | None |
| Example 20 | Good | None |
| Example 21 | Good | None |
| Example 22 | Good | None |
| Example 23 | Good | None |
| Example 24 | Good | None |
| Example 25 | Good | None |
| Example 26 | Good | None |
| Example 27 | Good | None |
| Example 28 | Good | None |
| Comp. Ex. 1 | Incomplete | None |
| Comp. Ex. 2 | Incomplete | None |

It is apparent from the results of Table 9 that the composition of the invention can remove the polymeric deposits on a wiring layer, and does not corrode the wiring metal.

Test Example 10

Polymer-Removing Ability Test II (with a Surfactant)

A resist pattern was formed in the conventional manner, the pattern comprising a positive type photo-resist of naphthoquinone/novolak resin on a silicon wafer having on its surface an interlayer dielectric on an Al wiring layer (comprising three layers, i.e., Ti/TiN layer-Al layer-Ti/TiN layer). The silicon wafer having the resist pattern was subjected to dry-etching of oxide film according to the conventional method to form a via hole. Then, the remaining resist was removed by ashing with an oxygen gas.

The obtained silicon wafer having the via hole was immersed in each of the compositions of Examples 9 to 28 and Comparative Examples 6 and 7 at 25° C. for 10 minutes for removal of the polymer deposits. The wafer thus treated was rinsed with pure water. The results of removing the ashing residue on the silicon wafers (polymeric deposits) and occurrence or non-occurrence of corrosion of wiring metal were evaluated by SEM (scanning electron microscope) photographic observation. The results of removing the residue were rated as "good" or as "incomplete" (2-level rating). The occurrence or non-occurrence of corrosion of wiring metal was rated as "corroded" or "none" (2-level rating) The results are shown in Table 10.

TABLE 10

| Composition | Results of removing deposits | Occurrence or non-occurrence of wiring metal |
|---|---|---|
| Example 9 | Good | None |
| Example 10 | Good | None |
| Example 11 | Good | None |
| Example 12 | Good | None |
| Example 13 | Good | None |
| Example 14 | Good | None |
| Example 15 | Good | None |
| Example 16 | Good | None |
| Example 17 | Good | None |
| Example 18 | Good | None |
| Example 19 | Good | None |
| Example 20 | Good | None |
| Example 21 | Good | None |
| Example 22 | Good | None |
| Example 23 | Good | None |
| Example 24 | Good | None |
| Example 25 | Good | None |
| Example 26 | Good | None |
| Example 27 | Good | None |
| Example 28 | Good | None |
| Comp. Ex. 6 | Incomplete | None |
| Comp. Ex. 7 | Incomplete | None |

It is apparent from the results of Table 10 that the composition of the invention can remove deposits on an interlayer dielectric or in a via hole.

Test Example 11

Etch Rate of Insulating Film (with a Surfactant)

Since a via hole is formed of an oxide film, the shape of the hole is widely changed by cleaning if an etch rate of the cleaning composition is high. The following test was carried out to investigate the etch rate of oxide films using the polymer-removing composition of the invention.

Using the compositions of Examples 9 to 28, an etch rate of each film was determined by etching at 25° C. a test substrate comprising a silicon substrate having a thermal oxide film, BPSG film or NSG film formed on its surface. The results are shown in Table 11. The etch rate in the table is shown as Å/min.

TABLE 11

| Composition | Thermal oxide film | BPSG film | NSG film |
|---|---|---|---|
| Example 9 | 15 | 29 | 24 |
| Example 10 | 5.4 | 26 | 20 |
| Example 11 | 2.0 | 23 | 15 |
| Example 12 | 1.2 | 22 | 12 |
| Example 13 | 0.7 | 17 | 8.4 |
| Example 14 | 3.5 | 25 | 14 |
| Example 15 | 3.1 | 23 | 13 |
| Example 16 | 0.5 | 20 | 9.5 |
| Example 17 | 0.3 | 18 | 8.4 |
| Example 18 | 0.2 | 15 | 5.2 |

TABLE 11-continued

| Composition | Thermal oxide film | BPSG film | NSG film |
|---|---|---|---|
| Example 19 | 5.3 | 17 | 17 |
| Example 20 | 3.1 | 15 | 14 |
| Example 21 | 0.7 | 14 | 10 |
| Example 22 | 0.4 | 13 | 8.3 |
| Example 23 | 0.2 | 10 | 5.8 |
| Example 24 | 3.8 | 10 | 6.9 |
| Example 25 | 1.4 | 9.3 | 5.7 |
| Example 26 | 0.5 | 8.2 | 4.3 |
| Example 27 | 0.3 | 7.8 | 3.4 |
| Example 28 | 0.2 | 6.1 | 2.4 |

The results of Table 11 show that the composition of the invention can remove the polymer adhering to a thermal oxide film, BPSG film, NSG film or like films without significantly changing the shape of via hole.

The results of Test Examples 8 to 11 show that the composition of the invention shows a lower property of corroding metals than the polymer-removing compositions conventionally used, and can remove a polymer (deposits) without significantly changing the shape of via hole. Consequently such composition can be suitably used as a composition for removing a polymer adhering to a side wall of a metal gate, contact hole, via hole, capacitor, metal wiring and the like, or as a composition for removing a resist residue after ion implantation or for removing an adhered polymer after dry etching in a single damascene or dual damascene process. The composition of the invention has a low property of corroding metals, can etch a native oxide, and can remove polymeric deposits so that it can be suitably used as a composition for cleaning a contact hole and the like. Further the composition of the invention can be used also for cleaning after CMP because of its properties of rarely corroding metals and its capability of etching a native oxide.

What is claimed is:

1. A cleaning composition consisting of:
   (1) at least one of fluoride salts and hydrogendifluoride salts;
   (2) an organic solvent having a hetero atom or atoms;
   (3) optionally, one or more surfactants in an amount of from 0.0001 to 10.0 wt %;
   (4) optionally, one or more corrosion inhibitors, and
   (5) water.

2. The cleaning composition according to claim 1, wherein at least one of fluoride salts and hydrogendifluoride salts is formed from hydrofluoric acid and at least one member selected from the group consisting of ammonia, hydroxylamines, aliphatic amines, aromatic amines and aliphatic or aromatic quaternary ammonium salts.

3. The cleaning composition according to claim 1, wherein (2) the organic solvent having a hetero atom or atoms is at least one member selected from the group consisting of N,N-dimethylformamide, N,N-dimethylacetamide, dimethylsulfoxide, N-methyl-2-pyrrolidone, 1,3-dimethyl-2-imidazolidinone; methanol, ethanol, isopropyl alcohol (IPA), 1-propanol, 1-butanol, 2-butanol, t-butanol, 2-methyl-1-propanol, 1-pentanol, 1-hexanol, 1-heptanol, 4-heptanol, 1-octanol, 1-nonylalcohol, 1-decanol, 1-dodecanol; ethylene glycol, 1,2-propanediol, propylene glycol, 2,3-butanediol, glycerin; acetone, acetylacetone, methyl ethyl ketone; acetonitrile, propionitrile, butyronitrile, isobutyronitrile, benzonitrile; formaldehyde, acetaldehyde, propionaldehyde; ethylene glycol monomethyl ether, ethylene glycol monoethyl ether, diethylene glycol monobutyl ether; tetrahydrofuran, dioxane; trifluorethanol, pentafluoropropanol, 2,2,3,3-tetrafluoropropanol; sulfolane and nitromethane.

4. The cleaning composition according to claim 3, wherein (2) the organic solvent having a hetero atom or atoms is at least one oxygen-containing organic solvent selected from the group consisting of alcohols and ketone.

5. The cleaning composition according to claim 4, wherein (2) the oxygen-containing organic solvent is at least one member selected from the group consisting of isopropyl alcohol, ethanol and methanol, and the concentration of water is 10% by mass or lower.

6. The cleaning composition according to claim 4, wherein (2) the oxygen-containing organic solvent is acetone and the concentration of water is 20 to 40% by mass.

7. The cleaning composition according to claim 1, which comprises (1) a fluoride salt represented by $NR_4F$ (wherein Rs are the same or different and each is a straight-chain or branched-chain alkyl group of 1 to 12 carbon atoms which may be substituted with a fluorine atom or atoms, a phenyl group which may be substituted with a fluorine atom or atoms, or a hydrogen atom) in a concentration of 1% by mass or lower and/or a hydrogendifluoride salt represented by $NR_4HF_2$ (wherein Rs are as defined above) in a concentration of 0.001 to 1% by mass; (5) water in a concentration of 10% by mass or lower; and (2) at least one member selected from the group consisting of isopropyl alcohol, ethanol and methanol as the remainder.

8. The cleaning composition according to claim 1, wherein a fluoride salt represented by $NR_4F$ (wherein Rs are the same or different and each is a straight-chain or branched-chain alkyl group of 1 to 12 carbon atoms which may be substituted with a fluorine atom or atoms, a phenyl group which may be substituted with a fluorine atom or atoms, or a hydrogen atom) in a concentration of 1% by mass or lower and/or a hydrogendifluoride salt represented by $NR_4HF_2$ (wherein R is as defined above) in a concentration of 0.001 to 1% by mass; (5) water in a concentration of 20 to 40% by mass; and (2) acetone as the remainder.

9. The cleaning composition according to claim 1, surfactant (3) comprises at least one member selected from the group consisting of an anionic surfactant, a cationic surfactant, a nonionic surfactant and an aniphoteric surfactant.

10. The cleaning composition according to claim 9, wherein (3) the surfactant is an anionic surfactant.

11. The cleaning composition according to claim 10, wherein (3) the anionic surfactant has a sulfonic acid group.

12. The cleaning composition according to claim 11, wherein (3) the anionic surfactant is at least one member selected from the group consisting of a compound represented by $C_nH_mC_6H_3(SO_3H)Oph(SO_3H)$ (wherein ph is a phenylene group, n is an integer of 1 to 30 and m is an integer of 3 to 61) and a metal salt, an aminonium salt, a primary amine salt, a secondary amine salt and a tertiary amine salt of the compound.

13. The cleaning composition according to claim 11, wherein (3) the anionic surfactant is at least one member selected from the group consisting of a compound represented by $C_nH_mph(SC_3H)$ (wherein ph is a phenylene group, n is an integer of 1 to 30 and m is an integer of 3 to 61) and a metal salt, an ammonium salt, a primary amine salt, a secondary amine salt and a tertiary amine salt of the compound.

14. The cleaning composition according to claim 10, wherein the content of (3) the anionic surfactant is 0.001 to 10% by mass.

15. The cleaning composition according to claim 10, which comprises (1) a fluoride salt represented by $NR_4F$ (wherein Rs are the same or different and each is a straight-chain or branched-chain alkyl group of 1 to 12 carbon atoms which may be substituted with a fluorine atom or atoms, a phenyl group which may be substituted with a fluorine atom or atoms, or a hydrogen atom) in a concentration of 1% by mass or lower and/or a hydrogendifluoride salt represented by $NR_4HF_2$ (wherein Rs are as defined above) in a concentration of 0.001 to 1% by mass; (5) water in a concentration of 60% by mass or lower; (3) an anionic surfactant in a concentration of 0.001 to 10% by mass and (2) at least one member selected from the group consisting of isopropyl alcohol, ethanol and methanol as the remainder.

16. The cleaning composition according to claim 1, which is characterized by use for cleaning at least one of a metal gate, a contact hole, a via hole and a capacitor.

17. The cleaning composition according to claim 1, which is characterized by use for removing a residual polymer derived from a resist.

18. The cleaning composition according to claim 1, which is characterized by use for cleaning after CMP.

* * * * *